United States Patent [19]

Saburi et al.

[11] Patent Number: 4,782,310
[45] Date of Patent: Nov. 1, 1988

[54] HIGH FREQUENCY FILTER ASSEMBLY FOR ELECTRIC INSTRUMENT

[75] Inventors: Toshiki Saburi, Anjo; Nobuyuki Ohya, Kariya; Toru Yamazaki, Chiryu; Taisei Katoh, Aichi, all of Japan

[73] Assignee: Nippondenso Co., Ltd., Kariya, Japan

[21] Appl. No.: 911,999

[22] Filed: Sep. 26, 1986

[30] Foreign Application Priority Data

Sep. 26, 1985 [JP] Japan .................. 60-213364

[51] Int. Cl.$^4$ .............................................. H03H 7/01
[52] U.S. Cl. ........................................ 333/167; 333/12; 333/181; 333/185; 361/303; 361/312
[58] Field of Search .................. 333/167, 181–185, 333/12, 202, 138–140; 361/301–313

[56] References Cited

U.S. PATENT DOCUMENTS

| 2,558,748 | 7/1951 | Haeff ..................... 333/202 |
| 4,203,081 | 5/1980 | Braeckelmann ............. 333/138 |
| 4,589,720 | 5/1986 | Aujla et al. ............. 333/185 X |

FOREIGN PATENT DOCUMENTS

| 0132327 | 1/1985 | European Pat. Off. |
| 0169053 | 1/1986 | European Pat. Off. |
| 58-61583 | 4/1983 | Japan . |
| 0033702 | 2/1985 | Japan ................... 333/185 |
| 0094515 | 5/1985 | Japan ................... 333/182 |

OTHER PUBLICATIONS

Abstract of Jpn. No. 57-140047 vol. 6, #238, 11/26/82.

Primary Examiner—Marvin L. Nussbaum
Attorney, Agent, or Firm—Cushman, Darby & Cushman

[57] ABSTRACT

A high frequency filter assembly for an electric instrument including an internal electric circuit element arranged within a casing of metallic conductive material, and a connector mounted on a peripheral wall of the casing for connecting an external electric circuit to the internal electric circuit element. The filter assembly comprises at least a pair of overlapped insulation thin plates to be arranged between the connector and a connection terminal of the circuit element, and an earth electrode strip disposed between the insulation thin plates and being connected to a portion of the casing. One of the insulation thin plates is integrally provided with a first signal electrode strip which has one end for connection to the connector and is associated with the earth electrode strip to form a first plate condenser, and the other insulation thin plate is integrally provided with a second signal electrode strip which is connected structurally in series with the first signal electrode strip for connection to the connection terminal of the circuit element and associated with the earth electrode strip to form a second plate condenser electrically in parallel connection with the first plate condenser.

3 Claims, 6 Drawing Sheets

HIGH FREQUENCY FILTER ASSEMBLY FOR ELECTRIC INSTRUMENT

BACKGROUND OF THE INVENTION

1. Field of the Invention

The present invention relates to a high frequency filter assembly for electric instruments, and more particularly to a high frequency filter assembly for protecting electric instruments from inductive interference caused by various electromagnetic waves from a broadcasting station, an amateur wireless station, a civil wireless station, a personal wireless system, a military rader system and the like.

2. Description of the Prior Art

In Japanese Patent Early Publication No. 58-61583, there has been proposed a high frequency filter of this kind which is in the form of a tip type condenser. In use of the tip type condenser, reliable protection of the electric instruments from the inductive interference may not be effected due to insufficient band width of the filter characteristic. Furthermore, the tip type condensor is relatively large in size when adapted to an integrated circuit element in a limited space. Meanwhile, a presently proposed high frequency filter effective in a broad wireless frequency band is costly to manufacture.

SUMMARY OF THE INVENTION

It is, therefore a primary object of the present invention to provide a high frequency filter assembly wherein a plurality of plate condensers are formed in a possibly small size to enhance cut-off characteristic of the filter assembly at a low cost.

According to the present invention, the object is attained by providing a high frequency filter assembly for an electric instrument including a casing of metallic conductive material, an internal electric circuit element arranged within the casing, and a connector mounted on a peripheral wall of the casing for connecting an external electric circuit to the internal electric circuit element. The high frequency filter assembly comprises at least a pair of mutually overlapped insulation thin plates to be arranged between the connector and a connection terminal of the circuit element, and an earth electrode strip disposed between the insulation thin plates and being connected to a portion of the casing. One of the insulation thin plates is integrally provided with a first signal electrode strip which has one end for connection to the connector and is associated with the earth electrode strip to form a first plate condenser, and the other insulation thin plate is integrally provided with a second signal electrode strip which is connected structurally in series with the first signal electrode strip for connection to the connection terminal of the circuit element and associated with the earth electrode strip to form a second plate condenser electrically in parallel connection with the first plate condenser.

Preferably, the earth electrode strip is laterally arranged between the insulation thin plates, one of the insulation thin plates is integrally provided with a plurality of laterally spaced first signal electrode strips which are arranged in parallel for connection to the connector and perpendicularly to the earth electrode strip and associated with the earth electrode strip to form a plurality of laterally spaced first plate condensers, and the other insulation thin plate is integrally provided with a plurality of laterally spaced second signal electrode strips which are arranged in parallel for connection to a plurality of connection terminals of the circuit element and perpendicularly to the earth electrode strip and connected structurally in series with the first signal electrode strips, the second signal electrode strips being associated with the earth electrode strip to form a plurality of laterally spaced second plate condensers electrically in parallel connection with the first plate condensers.

Alternatively, the high frequency filter assembly may comprise first, second and third insulation thin plates successively overlapped to be arranged between the connector and a connection terminal of the circuit element, and an earth electrode strip disposed between the first and second insulation thin plates and being connected to a portion of the casing. The first insulation thin plate is integrally provided with a first signal electrode strip which has one end for connection to the connector and is associated with the earth electrode strip to form a first plate condenser, and the third insulation thin plate is integrally provided with a second signal electrode strip which is connected structurally in series with the first signal electrode strip for connection to the connection terminal of the circuit element and associated with the earth electrode strip to form a second plate condenser electrically in parallel connection with the first plate condenser.

If necessary, the high frequency filter assembly may further comprise a fourth insulation thin plate overlapped with the third insulation thin plate, and a second earth electrode strip disposed between the third and fourth insulation thin plates and associated with the second signal electrode strip to form a third plate condenser electrically in parallel connection with the first and second plate condensers.

Alternatively, the high frequency filter assembly may comprise first, second and third insulation thin plates successively overlapped to be arranged between the connector and a connection terminal of the circuit element, and an earth electrode strip disposed between the first and second insulation thin plates and being connected to a portion of the casing. In this case, the first insulation thin plate is integrally provided with a first signal electrode strip which has one end for connection to the connector and another end for connection to the correction terminal of the circuit element and is associated with the earth electrode strip to form a first plate condenser, and the third insulation thin plate is integrally provided with a second signal electrode strip which has one for connection to the connector and another end for connection to another connection terminal of the circuit element and associated with the earth electrode strip to form a second plate condenser. If necessary, the filter assembly may further comprise a second earth electrode strip integrally provided on the third insulation thin plate and associated with the second signal electrode strip to form a third plate condenser.

BRIEF DESCRIPTION OF THE DRAWINGS

Additional objects, features and advantages of the present invention will become more readily apparent from the following detailed description of certain preferred embodiments thereof when taken together with the accompanying drawings, in which.

DESCRIPTION OF THE PREFERRED EMBODIMENTS

Figure 1:
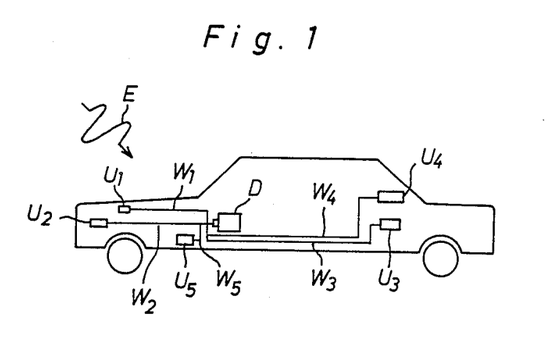
FIG. 1 is a schematic illustration of an automotive vehicle equipped with an electronic control device.

Referring now to the drawings, particularly in FIG. 1 there is illustrated an automotive vehicle equipped with an electronic control system which comprises a plurality of sensors and actuators $U_1$, $U_2$, $U_3$, $U_4$ and $U_5$, and an electronic control device D connected to the sensors and actuators by way of leading wires $W_1$, $W_2$, $W_3$, $W_4$ and $W_5$. In such an arrangement, each length of leading wires $W_1$–$W_5$ is determined by relative arrangement among the respective sensors and actuators $U_1$–$U_5$ and the electronic control device D.

Figure 2:
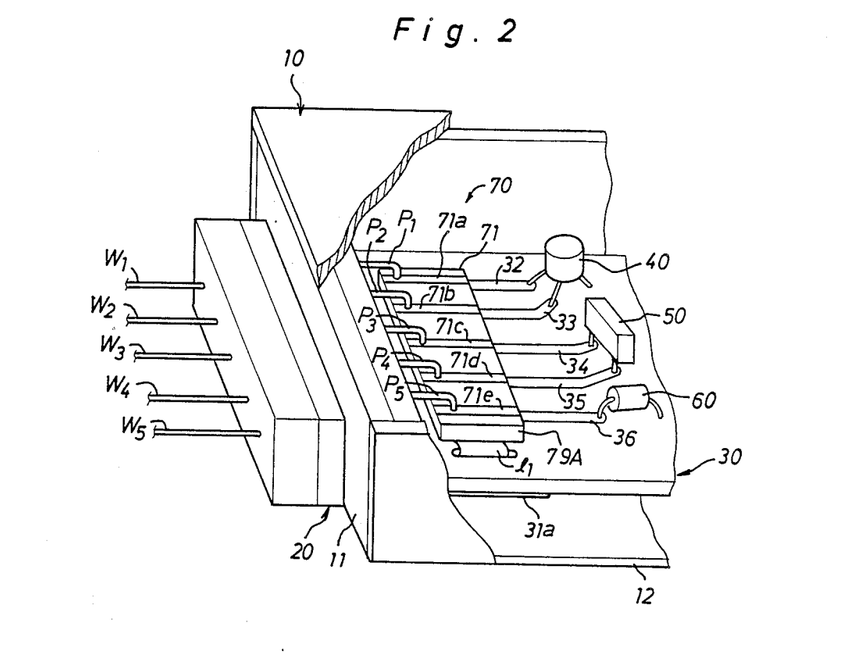
FIG. 2 is a perspective view illustrating a first embodiment of a high frequency filter assembly in accordance with the present invention arranged within the electronic control device of FIG. 1.

As is illustrated in FIG. 2, the electronic control device D includes a casing 10 of metallic conductive material and a connector 20 fixedly coupled within a rectangular hole in the front wall 11 of casing 10 for connection to the leading wires $W_1$–$W_5$. The casing 10 is mounted and insulated in place on a stationary structure in an interior of the vehicle body such as a passenger compartment, an engine room, a trunk room or the like. The connector 20 is provided with a plurality of L-letter shaped connecting pins $P_1$–$P_5$ which are arranged in parallel to each other and connected respectively at their inner ends to the leading wires $W_1$–$W_5$ through the connector 20.

Arranged within the casing 10 is a printed circuit board 30 of insulation material which is mounted on the bottom wall 12 of casing 10 by means of a plurality of support members made of metallic conductive material (not shown). A pair of laterally spaced parallel copper thin films or strips 31a are secured to the bottom surface of printed circuit board 30 and connected to the bottom wall 12 of casing 10 through the support members. (In FIG. 2, one of the copper thin strips 31a is illustrated.) The printed circuit board 30 is integrally provided thereon with a plurality of parallel wiring layers 12, 33, 34, 35 and 36 which are arranged to correspond with the connecting pins $P_1$–$P_5$, respectively. In such an arrangement, the printed circuit board 30 is provided thereon with electronic elements 40, 50 and 60. The electronic element 40 has a terminal fixedly mounted on the printed circuit board 30 and a pair of terminals soldered to the wiring layers 32 and 33. The electronic element 50 has a pair of terminals soldered to the wiring layers 34 and 35, and the electronic element 60 has a terminal soldered to the wiring layer 36 and another terminal fixedly mounted on the printed circuit board 30.

Figure 3:
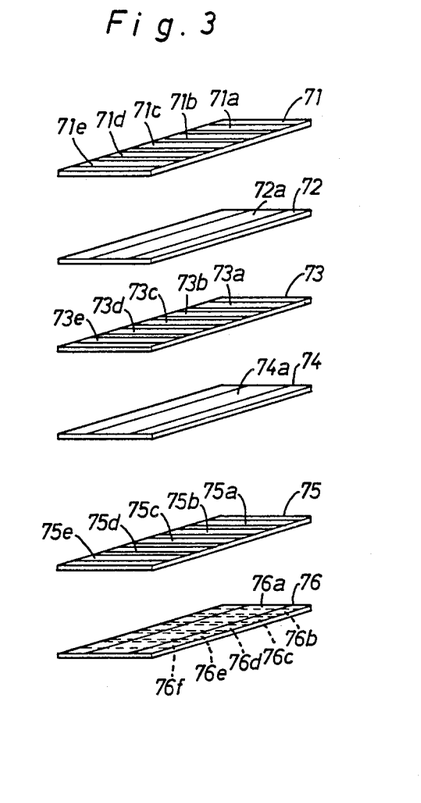
FIG. 3 is an exploded perspective view illustrating the components of the high frequency filter assembly shown in FIG. 2.
Figure 4:
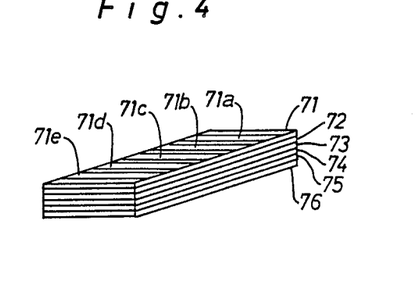
FIG. 4 is a perspective view of the mutually overlapped components.

As shown in FIG. 2, a high frequency filter assembly 70 in accordance with the present invention is mounted on the printed circuit board 30 at a lateral space between the connector 20 and the wiring layers 32–36. As shown in FIG. 3, the high frequency filter assembly 70 includes rectangular insulation thin plates 71–76 which are successively overlapped and secured to each other, as shown in FIG. 4. The insulation thin plate 71 is integrally provided thereon with laterally equi-spaced paralled signal electrode strips 71a–71e which are soldered at their front ends to the connecting pins $P_1$–$P_5$, respectively. The insulation thin plates 71–76 each are made of a dielectric material of thickness 0.1 mm-1 mm whose dielectric constant and loss factor are large in a wireless frequency region. Similarly to the thin plate 71, the insulation thin plate 73 is integrally provided thereon with laterally equi-spaced parallel signal electrode strips 73a–73e which are arranged to correspond with the signal electrode strips 71a–71e, and the insulation thin plate 75 is integrally provided thereon with laterally equi-spaced parallel signal electrode strips 75a–75e which are arranged to correspond with the signal electrode strips 73a–73e.

The insulation thin plate 72 is integrally provided thereon with a lateral earth electrode strip 72a which is arranged to be located perpendicularly to the signal electrode strips 71a–71e. Similarly, the insulation thin plate 74 is integrally provided thereon with a lateral earth electrode strip 74a which is arranged to be located perpendicularly to the signal electrode strips 73a–73e. The insulation thin plate 76 is integrally provided at the upper surface thereof with a lateral earth electrode strip 76a which is arranged to be located perpendicularly to the signal electrode strips 75a–75e. The insulation thin plate 76 is further integrally provided at the bottom surface thereof with laterally equi-spaced parallel signal electrode strips 76b–76f which are arranged to correspond with the signal electrodes 75a–75e and secured on the wiring layers 32–36, respectively (see FIG. 2).

Figure 5:
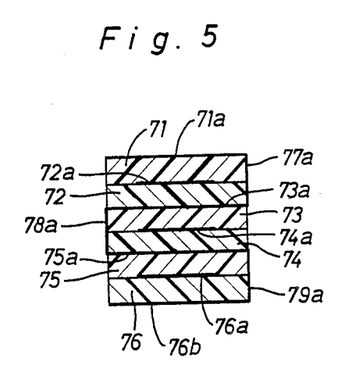
FIG. 5 is an enlarged cross-sectional view of the high frequency filter assembly shown in FIG. 2.
Figure 6:
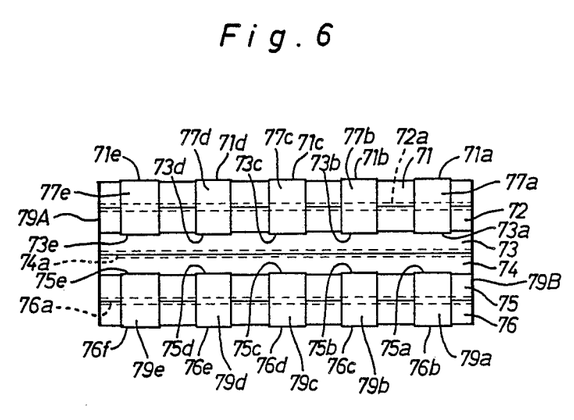
FIG. 6 is an enlarged rear view of the high frequency filter assembly shown in FIG. 2.

As shown in FIGS. 5 and 6, the signal electrode strips 71a–71e of thin plate 71 are structurally connected in series with the signal electrode strips 73a–73e of thin plate 73 by means of laterally equi-spaced parallel short electrode strips 77a–77e which are secured to the rear ends of thin plates 71 and 72. The signal electrode strips 73a–73e of thin plate 73 are structurally connected in series with the signal electrode strips 75a–75e of thin plate 75 by means of laterally equi-spaced parallel short electrode strips 78a–78e which are secured to the front ends of thin plates 73 and 74. (In the figures, only the short electrode strip 78a is illustrated.) The signal electrode strips 75a–75e of thin plate 75 are further structurally connected in series with the signal electrode strips 76b–76f of thin plate 76 by means of laterally equi-spaced parallel short electrode strips 79a–79e which are secured to the rear ends of thin plates 75 and 76. The lateral earth electrode strips 72a, 74a and 76a are connected to each other by means of a pair of short electrode strips 79A and 79B which are secured to the opposite sides of thin plates 71–76. The short electrode strips 79A and 79B are integrally connected at their lower ends with a pair of leading strips $L_1$ which are extended downwardly through the printed circuit board 30 and soldered to the copper thin strips 31a. (In FIG. 2, one of the leading strips $L_1$ is illustrated.)

In the above-described high frequency filter assembly 70, the signal electrode strips 71a, 73a, 75a and 76b are structurally connected in series through the mutually overlapped insulation thin plates 71–76 by means of the short electrode strips 77a, 78a and 79a, and the lateral earth electrode strips 72a, 74a and 76a are connected to the ground through the short electrode strips 79A and 79B. Similarly, the remaining signal electrode strips 71b, 73b, 75b and 76c; 71c, 73c, 75c and 76d; 71d, 73d, 75d and 76e; 71e, 73e, 75e and 76f each are structurally connected in series through the mutually overlapped insulation thin plates 71–76. Thus, a plurality of plate condensers are formed in parallel connection by means of the electrode strips 71a–76a and 76b overlapped respectively through the insulation thin plates 71–76. Similarly, a plurality of plate condensers are formed in parallel connection respectively by means of the remaining electrode strips overlapped respectively through the insulation thin plates 71–76. This is effective to provide electrostatic capacity between the electrode strips 71a, 76b; 71b, 76c; 71c, 76d; 71d, 76e; and 71e, 76f in a large value thereby to enhance the cut-off characteristic of the high frequency filter assembly 70 in a broad wireless frequency band in a possibly small size. Furthermore, the mutually overlapped insulation plates 71–76 are useful to ensure sufficient mechanical strength of the high frequency filter assembly 70, and also the cut-off characteristic of the filter assembly 70 can be adjusted by variation of the number and thickness of the insulation thin plates.

Assuming that as is illustrated in FIG. 1, the vehicle receives various electromagnetic waves E from a source of electromagnetic waves, such as a broadcasting station, an amateur wireless station, a civil wireless station, a personal wireless system, a military rader system and the like, there will occur a high frequency inductive current I flowing to the high frequency filter assembly 70 through the leading wires $W_1-W_5$ and the connector 20. In the high frequency filter assembly 70, the insulation thin plates 71–76 cause the inductive current I to flow toward the bottom wall 12 of casing 10 through the respective earth electrode strips 72a, 74a and 76a, the short electrode strips 79A, 79B and the copper thin films 31a and act to block flow of the inductive current I toward the electronic elements 40, 50 and 60. Thus, the electronic elements 40, 50 and 60 are applied with only signal currents from the sensors and actuators $U_1-U_5$ respectively through the leading wires $W_1-W_5$, connector 20, signal electrode strips 71a–71e, short electrode strips 77a–77e, signal electrode strips 73a–73e, short electrode strips 78a–78e, signal electrode strips 75a–75e, short electrode strips 79a–79e, signal electrode strips 76b–76f and wiring layers 32–36.

Figure 7:
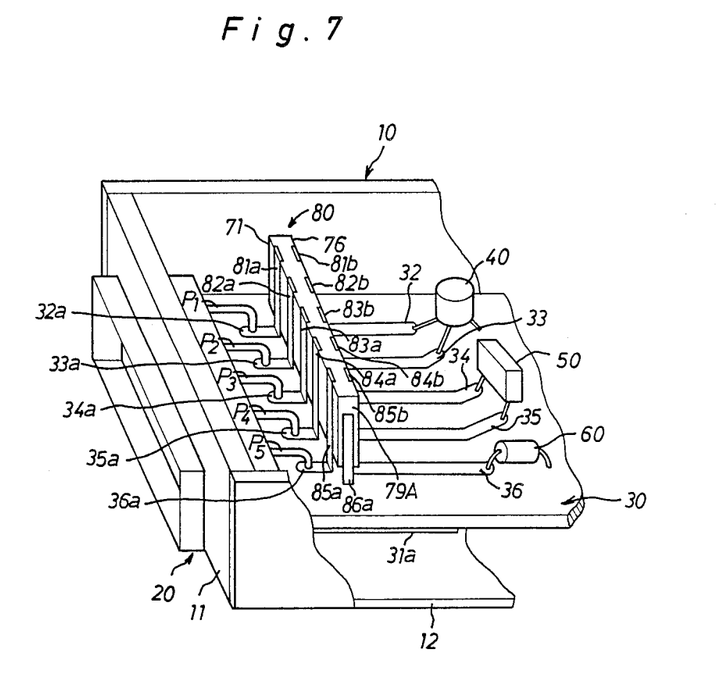
FIG. 7 is a perspective view of a second embodiment of a high frequency filter assembly in accordance with the present invention.

In FIG. 7 there is a second embodiment of the present invention wherein the high frequency filter assembly 70 is replaced with an upright high frequency filter assembly 80 on the printed circuit board 30. The high frequency filter assembly 80 comprises vertical connecting plates 81a–85a respectively soldered to the signal electrode strips 71a–71e of insulation thin plate 71 in the high frequency filter assembly 70, vertical connecting plates 81b–85b respectively soldered to the signal electrode strips 76b–76f of insulation thin plate 76, and a pair of vertical connecting plates 86a respectively soldered to the short electrode strips 79A and 79B. (In FIG. 7, one of the vertical connecting plates 86a is illustrated.) The vertical connecting plates 81a–85a are fixedly mounted on the printed circuit board 30 and connected at their lower ends with parallel wiring layers 32a–36a which are integrally provided on the printed circuit board 30 to correspond with the connecting pins $P_1-P_5$. The vertical connecting plates 81b–85b are fixedly mounted on the printed circuit board 30 and connected at their lower ends with the wiring layers 32–36, and the vertical connecting plates 86a are fixedly mounted on the printed circuit board 30 and connected at their lower ends to the copper thin films 31a, respectively. The wiring layers 32a–36a are connected to the connecting pins $P_1-P_5$. The other construction of filter assembly 80 is substantially the same as that of filter assembly 70.

Assuming that as described above, a high frequency inductive current I caused by various electromagnetic waves flows to the high frequency filter assembly 80 through the leading wires $W_1-W_5$ and connector 20, the insulation thin plates 71–76 cause the inductive current I to flow toward the bottom wall 12 of casing 10 through the earth electrode strips 72a, 74a and 76a, short electrode strips 79A, 79B, vertical connecting plates 86a and copper thin films 31a. Thus, the high frequency filter assembly 80 acts to cut off the inductive current I so as to apply only signal currents from the sensors and actuators $U_1-U_5$ to the electronic elements 40, 50 and 60 through the leading wires $W_1-W_5$ and connector 20. In this embodiment, the vertical earth electrode strips 72a, 74a and 76a in filter assembly 80 are useful to spatially isolate the electronic elements 40, 50 and 60 from the connector 20 thereby to block the electromagnetic waves directly applied to the electronic elements.

Figure 8:
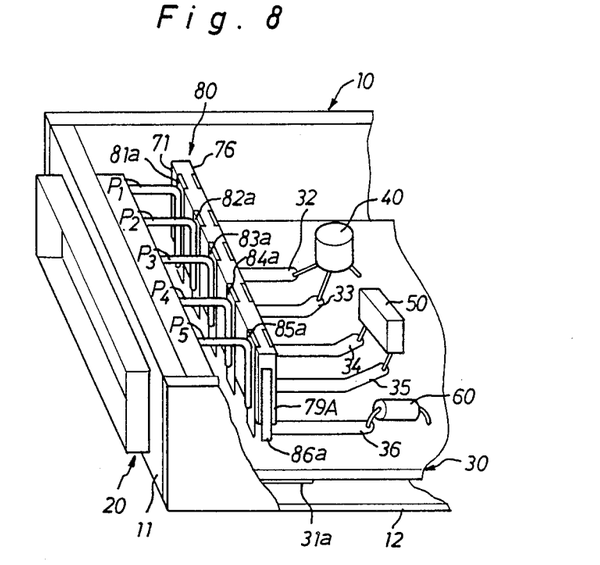
FIG. 8 is a perspective view of a modification of the high frequency filter assembly shown in FIG. 7.
Figure 9:
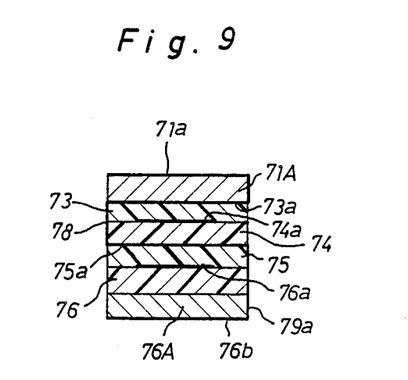
FIG. 9 is an enlarged cross-sectional view of a modification of the high frequency filter assembly shown in FIGS. 2-6.

In FIG. 8 there is illustrated a modification of the second embodiment wherein the connecting pins $P_1-P_5$ are directly soldered to the vertical connecting plates 81a–85a of filter assembly 80. In this modification, it is able to eliminate undesired influence caused by high frequency noises directly acting on the wiring layers 32a–36a. In FIG. 9 there is illustrated a modification of the high frequency filter assembly 70 wherein the insulation thin plate 72 and earth electrode strip 72a are eliminated and wherein the insulation thin plate 71 is replaced with a ferrite plate 71A which is provided thereon with the signal electrode strips 71a–71e and overlapped with the insulation thin plate 73. In this modification, an additional ferrite plate 76A is secured to the bottom surface of insulation thin plate 76 and is provided at the bottom surface thereof with the signal electrode strips 76b–76f. The ferrite plates 71A and 76A are useful to increase an inductance component of impedance of the signal electrode strips thereby to enhance the cut-off characteristic of the high frequency filter assembly.

Figure 10:
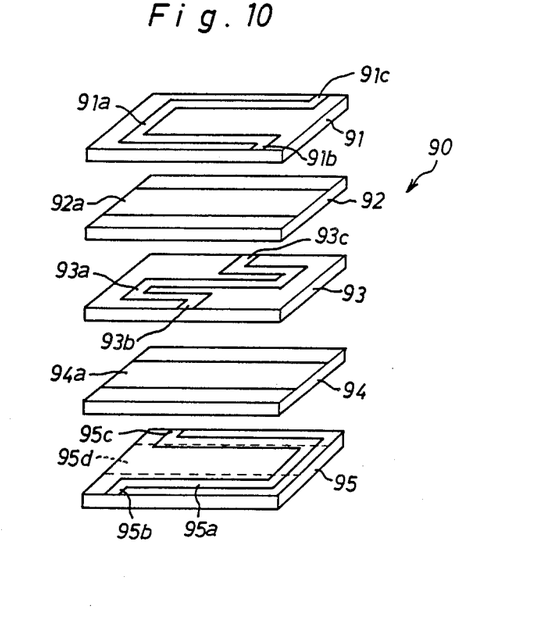
FIG. 10 is an exploded perspective view of a third embodiment of a high frequency filter assembly in accordance with the present invention.
Figure 11:
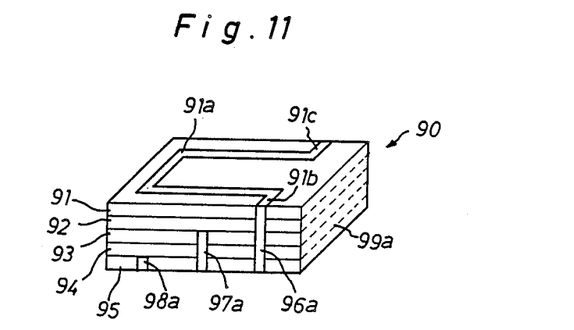
FIG. 11 is a perspective view of the high frequency filter assembly shown in FIG. 10.

In FIGS. 10 and 11 there is illustrated a third embodiment of the present invention in the form of a high frequency filter assembly 90 which is constructed to be mounted on the printed circuit board 30 at a space between the wiring layers 34a–36a and 34–36 shown in FIG. 7. The high frequency filter assembly 90 comprises insulation thin plates 91–95 which are successively overlapped and secured to each other as shown in FIG. 11. The insulation thin plate 91 is integrally provided thereon with a U-letter shaped signal electrode strip 91a which has front and rear ends 91b and 91c for connection to the wiring layers 36a and 36. The insulation thin plate 93 is integrally provided thereon with a sinuous signal electrode strip 93a which has front and rear ends 93b and 93c for connection to the wiring layers 35a and 35. The insulation thin plate 92 is integrally provided thereon with a lateral earth electrode strip 92a, and the insulation thin plate 94 is integrally provided thereon with a lateral earth electrode strip 94a which is arranged to correspond with the lateral earth electrode strip 92a. The insulation thin plate 95 is integrally provided at the upper surface thereof with a U-letter shaped signal electrode strip 95a which has front and rear ends 95b and 95c for connection to the wiring layers 34a and 34. The insulation thin plate 95 is further integrally provided at the bottom surface thereof with a lateral earth electrode strip 95d which is arranged to correspond with the lateral earth electrode strip 94a.

The signal electrode strip 91a of thin plate 91 is connected at its front end 91b to the wiring layer 36a by means of a short electrode strip 96a which is secured to the front ends of insulation thin plates 91-95. The rear end 91c of signal electrode strip 91a is connected to the wiring layer 36 by means of a short electrode strip (now shown) which is secured to the rear ends of insulation thin plates 91-95. The signal electrode strip 93a of thin plate 93 is connected at its front end 93b to the wiring layer 35a by means of a short electrode strip 97a which is secured to the front ends of insulation thin plates 93-95. The rear end 93c of signal electrode strip 93a is connected to the viring layer 35 by means of a short electrode strip (not shown) which is secured to the rear ends of insulation thin plates 93-95. The signal electrode strip 95a of thin plate 95 is connected at its front end 95b to the wiring layer 34a by means of a short electrode strip 98a which is secured to the front end of insulation thin plate 95. The rear end 95c of signal electrode strip 95a is connected to the wiring layer 34 by means of a short electrode strip (not shown) which is secured to the rear end of insulation thin plate 95. The lateral earth electrode strips 92a, 94a and 95d are connected to each other by means of a pair of short electrode plates 99a which are secured to opposite side ends of insulation thin plates 91-95. (In the figures, one of short electrode plates 99a is illustrated). The short electrode plates 99a are connected at their lower ends with a pair of leading strips which are extended downwardly through the printed circuit board 30 and soldered to the copper thin strips 31a.

In the high frequency filter assembly 90, a plurality of plate condensers are formed in parallel connection by means of the electrode strips 91a-95a and 95d overlapped respectively through the insulation thin plates 91-95. This is effective to provide an electrostatic capacity between the electrode strips 91a and 95d in a large value thereby to enhance cut-off characteristic of the high frequency filter assembly 90 in a broad wireless frequency band in a possibly small size.

Obviously, many other modifications and variations of the present invention are possible in the light of the above teachings. It is therefore to be understood that within the scope of the appended claims, the invention may be practiced otherwise than as specifically described herein.

What is claimed is:

1. A high frequency filter assembly for an electric instrument including a casing of metallic conductive material, an internal electric circuit element arranged within said casing, and a connector mounted on a peripheral wall of said casing for connecting an external electric circuit to said internal electric circuit element, said high frequency filter assembly comprising:
   at least first, second, third and fourth insulation thin plates successively overlapped to be arranged between said connector and a connection terminal of said circuit element;
   a first earth electrode strip disposed between said first and second insulation thin plates;
   a second earth electrode strip disposed between said third and fourth insulation thin plates, said first and second earth electrode strips being connected to a portion of said casing;
   a first signal electrode strip integrally provided on the upper surface of said first insulation thin plate for connection to said connector and being associated with said first earth electrode strip to form a first plate condenser;
   a second signal electrode strip integrally provided on said third insulation thin plate and being associated with said first and second earth electrode strips to form second and third plate condensers; and
   a third signal electrode strip integrally provided on the bottom surface of said fourth insulation thin plate for connection to the connection terminal of said circuit element and being associated with said second earth electrode strip to form a fourth plate condenser;
   wherein said second signal electrode strip is connected structurally in series at one end thereof with one end of said first signal electrode strip and at another end thereof with one end of said third signal electrode strip to electrically connect said plate condensers in parallel.

2. A high frequency filter assembly as claimed in claim 1, further comprising a ferrite plate overlapped with said first insulation thin plate and being provided thereon with an additional signal electrode strip for connection to said connector, said additional signal electrode strip having one end connected structurally in series with another end of said first electrode strip.

3. A high frequency filter assembly for an electric instrument including a casing of metallic conductive material, an internal electric circuit element arranged within said casing, and a connector mounted on a peripheral wall of said casing for connecting an external electric circuit to said internal electric circuit element, said high frequency filter assembly comprising:
   at least first, second, third and fourth insulation thin plates successively overlapped to be arranged between said connector and a plurality of connection terminals of said circuit element;
   a first earth electrode strip laterally disposed between said first and second insulation thin plates;
   a second earth electrode strip laterally disposed between said third and fourth insulation thin plates, said first and second earth electrode strips being connected at their opposite ends to a portion of said casing;
   a plurality of laterally spaced first parallel signal electrode strips provided on the upper surface of said first insulation thin plate for connection to said connector and arranged perpendicularly to said first earth electrode strip, said first parallel signal electrode strips being associated with said first earth electrode strip to form a plurality of laterally spaced first plate condensers;

a plurality of laterally spaced second parallel signal electrode strips provided on said third insulation thin plate and arranged perpendicularly to said second earth electrode strip, said second parallel signal electrode strips being associated with said first and second earth electrode strips to form a plurality of laterally spaced second plate condensers and a plurality of laterally spaced third plate condensers; and a plurality of laterally spaced third parallel signal electrode strips provided on the bottom surface of said fourth insulation thin plate for connection to the connection terminals of said circuit element and arranged perpendicularly to said second earth electrode strips, said third signal electrode strips being associated with said second earth electrode strip to form a plurality of laterally spaced fourth plate condensers;

wherein said second signal electrode strips are connected structurally in series at their one ends with each one of said first signal electrode strips and at their another ends with each one end of said third signal electrode strips to electrically connect said plate condensers in parallel

* * * * *